Dec. 27, 1966 R. KLOTZ 3,293,730

METHOD FOR WINDING INSULATING COMBS FOR USE AS PLUG-IN CONNECTIONS WITH CONTACT STRIPS

Filed Oct. 21, 1964 3 Sheets-Sheet 1

Dec. 27, 1966 R. KLOTZ 3,293,730

METHOD FOR WINDING INSULATING COMBS FOR USE AS PLUG-IN CONNECTIONS WITH CONTACT STRIPS

Filed Oct. 21, 1964 3 Sheets-Sheet 2

United States Patent Office 3,293,730

Patented Dec. 27, 1966

3,293,730
METHOD FOR WINDING INSULATING COMBS FOR USE AS PLUG-IN CONNECTIONS WITH CONTACT STRIPS

Roland Klotz, Steinheim an der Murr, Germany, assignor to International Standard Electric Corporation, New York, N.Y., a corporation of Delaware Filed Oct. 21, 1964, Ser. No. 405,553
Claims priority, application Germany, Oct. 26, 1963, St 21,234
6 Claims. (Cl. 29—155.5)

The invention relates to a method for winding insulating combs for use as plug-in connections with contact strips.

Methods and means are known in the prior art for forming contact points in plug connections or printed circuits from printed leads. Since such printed leads consist only of a relatively thin layer, the layer may rub through when pulled and plugged as a connect so that these simple forms of contact points are practical for use only in making limited plug-in connections.

Means are also known by which re-enforcements of printed leads at the plug-in connections are made by soldering contact plates. This measure permits repeated plugging and pulling, however, the individual contact plates frequently come loose unless the solder is very carefully applied.

For these reasons a strip of contact material is often used for said contact points. However, it is very difficult to fasten the thin contact strips economically and to fasten the contacting points of the wafers to printed circuits or to insulating combs. It is an object of the invention to find a method which permits such fixing in an economical manner. This is achieved according to the invention by the use of several contact strips, located side by side, which are advanced in an apparatus in a predetermined automatic or semi-automatic course, cut to a certain length and placed around an insulating comb or a suitably constructed insulating wafer either by bending or folding.

Various advantages are obtained by the invention. For one thing, the use of contact strips enables the plug-in connection to be made frequently at the contact points without the danger of excessive wear and tear at the contact points. The contact strips themselves are not wound individually, but in a group simultaneously around the insulating comb, resulting in economical production.

The insulating comb with the wound contact strips, can then be coupled in a known way on the side or on the front of the plate with printed circuits. Then the bent ends of the contact strips of the comb are soldered by the dip-soldering method to the printed circuit leads on the wafer.

According to the invention, the insulating comb to be wound with contact strips is at first inserted vertically into a receiving facility of said apparatus so that the contact strips reeling off in a certain interval, e.g. automatically, from a multi-layer contacting reel are below the insulating comb and so that these contacting strips are cut by cutting or bending dies to a certain length in front of the insulating comb in the direction of the reel. The comb is then shifted by another die perpendicular to the advancing direction of the contacting strips, whereby the cut-off strips wind around the insulating comb and by the effect of more bending dies the still freestanding ends of the contact strips are bent in a predetermined sequence around the insulating comb in such a way that the individual contact strips are tightly pressed to said comb.

According to a further embodiment of the invention the contacting strips cut-off the reel are bent at first by a die in parallel to the lateral sides of the insulating comb, whereby the die shows recesses over the entire length of the comb corresponding to the number of strips into which the bent ends of the contact strips protrude. A die bends the free ends of the contact strips in the direction towards the other free ends of said strips thus covering the last still available side of the comb with contacting material. The die hitherto keeping the comb in its position is thereupon removed upward from the apparatus and another die bends the contact strip ends, protruding over the insulating comb in the direction of the contact strip advance, whereby previously the parts of the apparatus have been shifted in the same direction. The free ends of the contacting strips bent are bent onto the other free ends of said strips by shifting a part of the apparatus towards the comb. Another die compresses the pre-bent ends of the contacting strips, after a part of the apparatus has been pulled back, in such a way that the other ends of the contacting strips are fixed in the bend ends of the contact strips.

According to a further embodiment of the invention the insulating comb wrapped with contacting strips is removed from the apparatus after the described work process is completed and all other parts of the apparatus return to their normal position, whereby the advancing spring presses a slight profile into the contacting strips.

According to another embodiment of the invention the individual parts of the apparatus are interconnected via a drive mechanism, couplings, rods and cam disks, in order to perform the method and these parts cooperate in an automatic or semi-automatic work process.

The above mentioned and other features of this invention and the manner of obtaining them will become more apparent, and the invention itself will be best understood by reference to the following description of an embodiment of the invention taken in conjunction with the accompanying drawings, in which.

Figure 1:
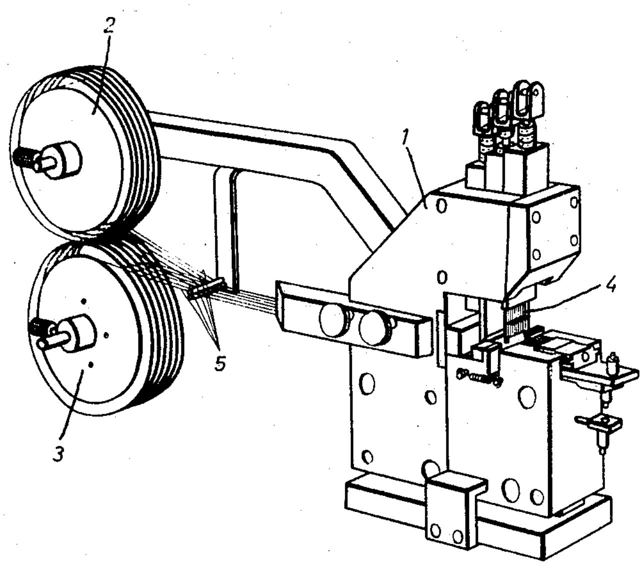
FIG. 1 shows a part of the apparatus without drive mechanism and control facilities in a perspective view.

In FIG. 1 a part of the apparatus marked 1, serves to wind contacting strips 5 onto insulating combs 4. The drive mechanism and the control facilities are not shown on the drawing for reasons of simplicity. The contacting strips 5 are on multi-layer reels 2 and 3 respectively, and are fed automatically into the apparatus.

Figures 2, 3, 4, 5, 6:
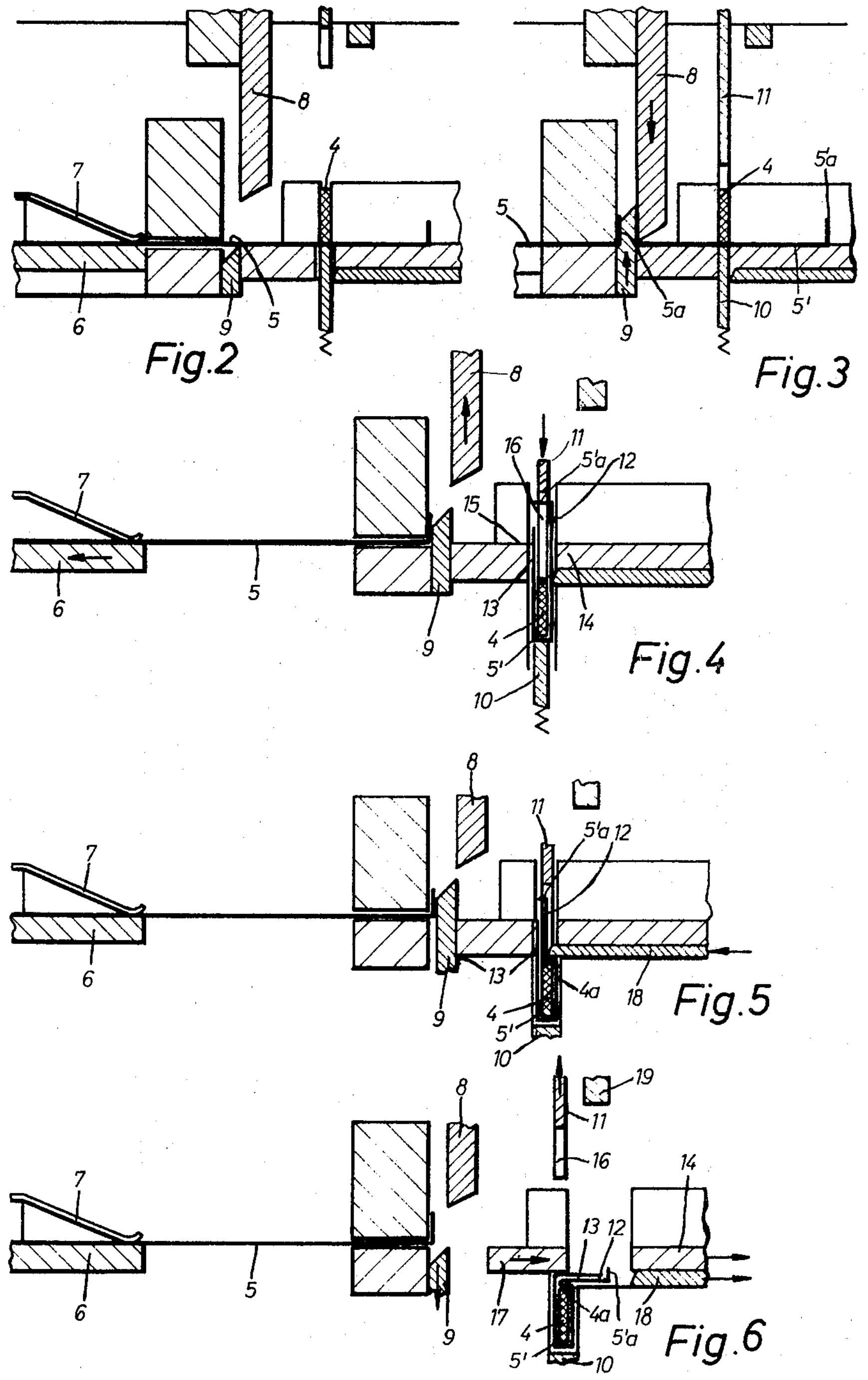
FIGS. 2 to 9 show the principle of operation of the invention by showing individual operating steps.

FIG. 2 represents the starting position of the individual parts of the apparatus 1. In this starting position an insulating comb 4 to be placed in the contact strips 5 is inserted into the apparatus 1.

FIG. 3 shows the work process or step by which the contact strips 5 are cut, after an advance to a certain length, by the dies 8 and 9 which are shifted within the apparatus 1 in the direction of the arrows. The end 5*a* of the not yet cut off contact strip is bent upward by the die 9. The strips 5' which have been cut-off are kept in their horizontal position within the apparatus between the insulating comb 4 under the effect of a die 11 and a border strip 10 which is elastic towards the top.

FIG. 4 represents another work process or step in the course of which the advancing plate 6 including the advancing spring 7 is returned in the direction of the arrow whereby a slight profile is impressed onto the strips 5 in order to increase their resistive moment. Furthermore, the cutting die 8 is removed from the apparatus towards the top and the die 11 inserted deeper into that apparatus whereby the comb 4 and the mobile part 10 of the device 1 is pressed off towards the bottom. The contact strips 5' clamped between the comb 4 and the border strip 10 as well as the die 11 touch at this motion with their free ends 12 and 13 the apparatus 1 in parallel to the lateral sides of the comb 4, led through the edges 14 and 15. The die 11 shows over the entire length of the comb 4 a number of recesses 16, corresponding to the number of strips 5 into which recesses the ends 5'a of the contact strips 5' engage, which ends were previously bent in a right angle when the contact strip was cut off the reel.

FIG. 5 shows another work process whereby inside the apparatus 1 a bending die 18 is advanced which bends the free ends 12 of the contact strips 5' over the edge 4a of the comb 4. The top ends 12 of said contact strips 5' are thereby placed closer to, but still in parallel to, the contact strip ends 13.

FIG. 6 shows a work process whereby the parts 14, 18, 9, and 11 leave the apparatus 1 and the ends 12 and 13 of the contact strips 5' are bent in common at a right angle with the aid of a die 17, moved in the advancing direction of the contact strips 5, so that the bent ends 5'a of the free ends 12 of the contact strips 5' bend towards the direction of the bending die 19 outside the apparatus.

Figures 7, 8, 9:
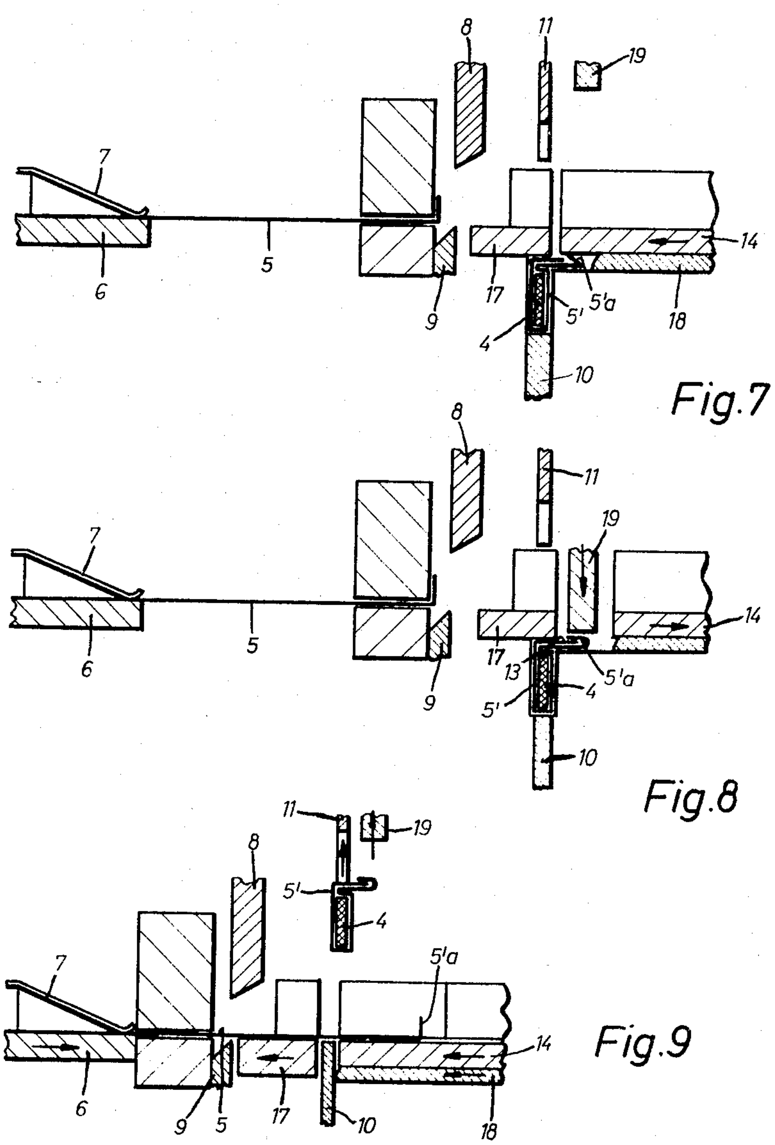

FIG. 7 shows how the part 14 is again inserted into the apparatus so that its front edge bends the ends 5'a of the contact strips 5' in the direction of the comb 4.

After the part 14 has been removed again from the apparatus, FIG. 8 shows that another die 19 enters the apparatus and presses the already pre-bent ends 5'a of the contact strips 5' together in such a way that the free ends 13 of the contact strips 5' are fixed by this pressing.

After completion of this work process or step the die 19 is restored to its normal position and the part 11 is inserted into the apparatus, whereby said part gets hold of the insulating comb wrapped with the contact strips 5' and lifts said comb from the apparatus, after the die 19 has returned to its normal position. Simultaneously, the parts 14, 18, 6 and 7 are shifted, respectively to their inoperative position as shown in FIG. 2, permitting the contact strips to slide on the reel slide simultaneously into the apparatus up to a predetermined length.

To perform the processes shown, according to the invention, the individual parts, e.g. 6, 7, 8, 9, 10, 11, 14, 17, 18, 19 are interconnected by a drive mechanism through couplings, clutches, rods, and cam disks and cooperate in an automatic or semi-automatic manner.

While the principles of the invention have been described above in connection with specific apparatus and applications, it is to be understood that this description is made only by way of example and not as a limitation on the scope of the invention.

What is claimed is:

1. A method for wrapping insulating combs for plug-in connections, comprising:
   - the step of bending the end of a contact strip at a right angle;
   - advancing said contact strip into a cutting position;
   - cutting said contact strip to a certain length;
   - placing an insulating comb in contact with said certain length of contact strip;
   - bending said contact strip to enclose the sides of said comb, leaving two trailing edges of said contact strip including the edge with the bend; and
   - bending the trailing edges of said contact strip at a sharp angle to more tightly enclose the comb.

2. A method for wrapping insulating combs for plug-in connections substantially as claimed in claim 1 and including the further step of:
   - bending the edge with the bend by an additional amount to lock it over the other trailing edge.

3. A method for wrapping insulating combs for plug-in connections with contact strips comprising:
   - the step of holding a contact strip;
   - moving said contact strip into feed-in apparatus;
   - placing a bend in the forward end of said contact strip;
   - placing a comb in contact with a side of said contact strip;
   - cutting-off a desired length of said contact strip;
   - wrapping said contact strip around said comb; and
   - bending the ends of said contact strip to fix the contact strip to said comb.

4. A method for wrapping insulating combs for plug-in connections substantially as claimed in claim 1, including the step of bending the edge of said contact strip with the bend over said other trailing edge.

5. A method for wrapping insulating combs for plug-in connections substantially as claimed in claim 4, including the step of pressing the two edges of the contact strip tightly together.

6. A method for wrapping insulating combs for plug-in connections substantially as claimed in claim 1, in which a comb is employed incorporating a plurality of recesses and including the step of engaging the recesses with said contact strip.

References Cited by the Examiner

UNITED STATES PATENTS

| | | | |
|---|---|---|---|
| 2,526,717 | 10/1950 | Weisberg | 29—203 X |
| 2,627,889 | 2/1953 | Morrison | 29—211 X |
| 2,836,287 | 5/1958 | Cady | 226—162 |
| 2,988,114 | 6/1961 | Barothy et al. | 140—93 |
| 3,059,321 | 10/1962 | Pityo | 29—155.5 |
| 3,200,857 | 8/1965 | Miller | 140—93 |

JOHN F. CAMPBELL, *Primary Examiner.*

THOMAS H. EAGER, *Examiner.*